United States Patent
Somani

(10) Patent No.: US 8,093,102 B2
(45) Date of Patent: *Jan. 10, 2012

(54) PROCESS OF FORMING AN ELECTRONIC DEVICE INCLUDING A PLURALITY OF SINGULATED DIE

(75) Inventor: Ajay Somani, Philadelphia, PA (US)

(73) Assignee: Freescale Semiconductor, Inc., Austin, TX (US)

( * ) Notice: Subject to any disclaimer, the term of this patent is extended or adjusted under 35 U.S.C. 154(b) by 986 days.

This patent is subject to a terminal disclaimer.

(21) Appl. No.: 11/770,295

(22) Filed: Jun. 28, 2007

(65) Prior Publication Data
US 2009/0001600 A1    Jan. 1, 2009

(51) Int. Cl.
*H01L 21/00* (2006.01)

(52) U.S. Cl. ........ 438/109; 438/113; 438/108; 438/118; 438/110; 438/119; 438/455; 438/666; 438/458; 257/686; 257/777

(58) Field of Classification Search .................. 438/109, 438/112, 113, 108, 118, 110, 119, 455, 666, 438/458; 257/686, 777
See application file for complete search history.

(56) References Cited

U.S. PATENT DOCUMENTS

| | | | |
|---|---|---|---|
| 6,841,883 B1 | 1/2005 | Farnworth et al. | |
| 2004/0212099 A1 | 10/2004 | Klein et al. | |
| 2006/0057836 A1* | 3/2006 | Nagarajan et al. | 438/622 |
| 2007/0267723 A1* | 11/2007 | Bernstein et al. | 257/621 |
| 2008/0308946 A1* | 12/2008 | Pratt | 257/777 |

OTHER PUBLICATIONS

Kostner, Hannes et al., "New Flip-Chip on Chip Process Supercedes Embedded Technologies," 14th European Microelectronics and Packaging Conference & Exhibition, Freidrichshafen, Germany, Jun. 23-25, 2003, pp. 1-6.

Tanaka, Naotaka et al., "Ultra-Thin 3D-Stacked SIP Formed Using Room-Temperature Bonding Between Stacked Chips," 2005 Electronic Components and Technology Conference, IEEE, 2005, pp. 788-794.

* cited by examiner

*Primary Examiner* — Junghwa M Im

(57) ABSTRACT

An electronic device can include a first die having a first terminal at a first front side, and a second die having a second terminal at a second front side and a through via. In one aspect, a process of forming the electronic device includes supplying a second substrate including a die location of the second die. The process can also include attaching the second substrate to a handling substrate and singulating the second die from the second substrate before removing the handling substrate. In another aspect, the handling substrate can include a rigid substrate. The process can include orienting the front side of the first die and a back side of the second substrate front-to-back with respect to each other. In yet another aspect, the first terminal is electrically connected to the through via and the second terminal. In one embodiment, the electronic device can include a third die.

20 Claims, 5 Drawing Sheets

PROCESS OF FORMING AN ELECTRONIC DEVICE INCLUDING A PLURALITY OF SINGULATED DIE

BACKGROUND

1. Field of the Disclosure

The present disclosure relates to electronic devices and methods, and more particularly, to electronic devices including a plurality of singulated die and methods of forming the same.

2. Description of the Related Art

Electronic devices can include a plurality of die packaged together to reduce the area taken up on a board over the area that would be taken up if the die are conventionally packaged and mounted on the board separately. Within such a package, the die can be stacked to further reduce the board area covered by the package. By packaging the die as a die stack, some of the connections between the die of the stack, that would conventionally require a connection and trace on the board if the die were not stacked, can be included within the package as an intrastack connection. Thus, the number of connections between the stack and the package (extrastack connections) can be reduced by stacking and forming intrastack connections among a plurality of die within a package rather than mounting and forming connection to the die conventionally.

However, packages that include die stacks can be relatively thicker than other packages that include single die or a plurality of die that are not stacked. Thus, a package including a die stack can be a thickest package on a board and a limiting form factor for how thin a space the board can occupy.

Packaging such a die stack can also require special processing techniques or equipment. A machine designed for performing conventional packaging may not have the clearance to manipulate the thicker die stack. For example, a thickness dimension of a mold for encapsulating such a die stack can be larger than a tool for conventional encapsulation can accommodate. Also, the additional thickness of the die stack can require a thicker packaging substrate to accommodate a deeper cavity in the packaging substrate to control the bond pad elevation of the die stack relative to the packaging leads.

One method of reducing the thickness of a package having stacked die is to use bump die attach technology rather than wire bonding to form intrastack and extrastack electrical connections. However, without forming through vias in some of the die of the die stack, stacking die using bump die attach can be limited to a two-layer stack with the die oriented front side to front side. Additionally, at least one of the two die of the front-to-front die stack typically is significantly larger than the other die of the die stack to allow for extrastack connections to be made from the die stack. This difference in size and shape can make stacking die of a same type that typically have a same size and shape, more difficult, as different pad layout can be required.

In another method of reducing the thickness of the die stack, a die of the die stack is thinned after becoming a portion of the die stack, such that the overall thickness of the die stack is reduced by the amount of the thinning of the die. The intrastack connections of the die stack can stabilize the die as it is thinned. However, using the die stack in this way is more likely to damage the die stack than if the die of the die stack is not thinned.

One method that allows for the stacking two or more die includes forming a through via such that a front to back connection can be made through at least one of the die of the die stack. Thus, forming through vias can allow the die stack to be formed with all die oriented with front sides facing substantially the same direction (e.g. front side to back side), despite having substantially the same size and shape. Front-to-back orientation with through vias can extend the number of layers of die in the stack to more than two.

However, as the die are thinned to accommodate forming through vias, handling the substrate can become so problematic as to be impractical. Physical robustness and rigidity of the die substrates or wafer substrates from which die substrates are formed varies with the substrate thickness and the area. For example, a wafer substrate of less than 200 microns thick, or a die substrate of less than 100 microns can be so thin as to deform under a vacuum. Such deformation can make formation of reliable bump connections more difficult because the bumps are not maintained in a same plane during placement of the die.

Accordingly, the industry continues to demand improved processes for forming die stacks for microelectronic application that include thinner die and have reliably formed intrastack connections.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures.

Figure 1:
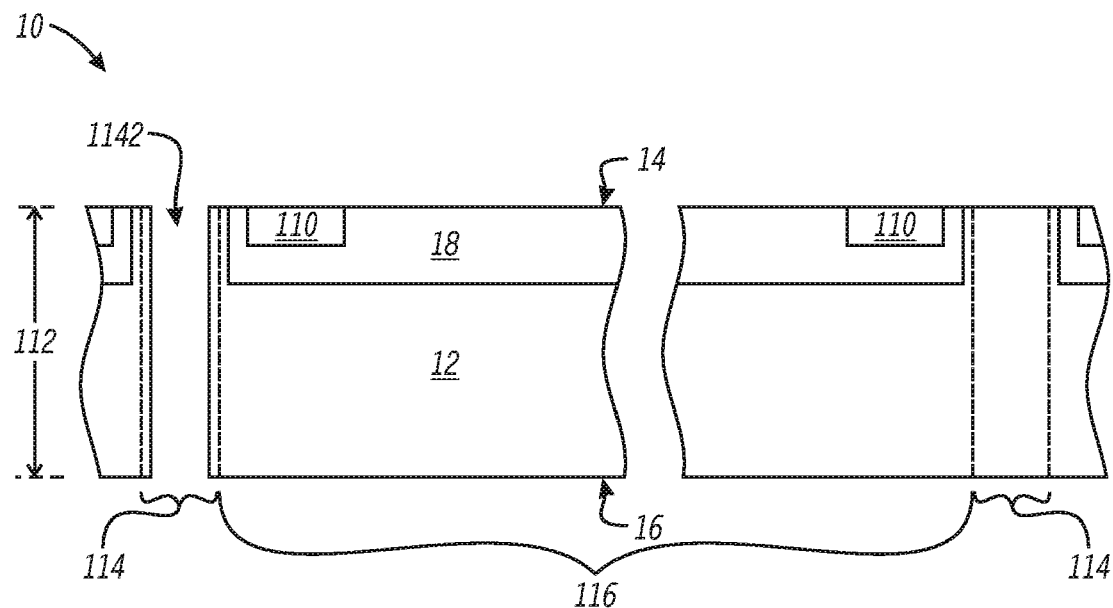
FIG. 1 includes an illustration of a cross-sectional view of a first workpiece including a first die of a first plurality of die on a first substrate.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

An electronic device is disclosed that includes a die stack including a plurality of stacked die that includes a die with a through via. The die of the die stack are arranged with the front side of one die abutting the back side of an adjacent die of the die stack. A bottom-most die of the die stack, i.e. the die having substantially all of its back side exposed, is a handling die and can be thicker than each of the other die of the die stack. The handling die can include an active region where components are formed. By including a handling die that is relatively thicker at a die stack or die location where a die stack is being formed that includes a die with a through via, a more physically robust die stack can be formed. Also, by maintaining the relatively thick handling die, the likelihood that the die stack will be damaged during subsequent processing can be reduced.

In one embodiment, a process of forming the electronic device includes forming a two-die stack. Forming the die stack includes attaching a rigid wafer handling substrate to the front side of a wafer substrate that includes a plurality of die locations. The wafer substrate is thinned prior to removing the wafer handling substrate to reduce the wafer substrate thickness at each of the die locations of the wafer substrate. After forming through vias at the die locations of the wafer substrate, an electrical connection is formed between a terminal on the front side of a wafer substrate and the through via. In one embodiment, the thinner die of the wafer substrate are less than approximately 90 microns in thickness. During singulation of individual die locations of the wafer substrate, the wafer substrate can remain attached to the handling substrate. The overall thickness of the die stack being formed can be reduced by forming the die stack with thinner die.

Additionally, in still another embodiment, a three-die stack is formed by attaching a previously formed two-die stack at a die location of another thinned wafer substrate and singulating the die location of the other thinned wafer substrate where the three-component die stack is being formed. By forming the two-die stack separately, there is an opportunity to confirm functionality of the two-die stack prior to attaching the two-die stack at a known good die location of the other wafer substrate during formation of the three-die stack. By using such a process, the likelihood of adding a two-die stack with poor intrastack connections onto good die at a die location of the other substrate is reduced. Specific embodiments of the present disclosure will be better understood with reference to FIGS. 1 through 9.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

The term "back side", when used with respect to a die or substrate, is intended to mean a major surface of the die or substrate opposite the side at which a component region is formed.

The term "component region" is intended to mean a portion at a major surface of a substrate at which a transistor is formed.

The term "die stack" is intended to mean a plurality of die electrically and physically connected to one another, wherein front side major surfaces of at least two die lie at substantially different elevations relative to the extrastack connections of the at least two die. As used herein, a die stack includes a die having a through via.

The term "die location" is intended to mean a site at a substrate where a single die will be formed.

The term "front side" is intended to mean the side of the substrate at which a component region is formed.

The term "singulate" is intended to mean a process of separating an individual die from a plurality of die locations at a substrate.

The term "through via" is intended to mean an interconnect structure formed through a die or wafer substrate that forms a conductive structure, or is electrically connected to conductive structures at the front side of the substrate, the back side of the substrate, or any combination thereof.

Unless otherwise defined, all technical and scientific terms used herein have the same meaning as commonly understood by one of ordinary skill in the art to which this invention belongs. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

FIG. 1 includes an illustration of a workpiece 10 including a substrate 12 having a front side surface 14 and a back side surface 16 and including a plurality of die locations including a particular die location 116 where a die will be formed. The front side surface 14 and the back side surface 16 are spaced apart from each other by a thickness 112. In one embodiment, substrate 12 includes a semiconductor material such as silicon, germanium, carbon, another semiconductor material, such as a III-V material or a II-VI material, or any combination thereof. Although illustrated as a bulk semiconductor material, substrate 12 can include other types of substrates capable of forming an electronic device such as a semiconductor on sapphire, a semiconductor on insulator, or another substrate including an active semiconductor region.

Die location 116 includes a component region 18 at front side surface 14. In one embodiment, component region 18 includes a terminal 110. In a particular embodiment, a transistor at component region 18 serves as a portion of a logic device, a memory device, a discrete device, an analog device, a sensor, an amplifier, a power device, or any combination thereof. Component region 18 can be formed using a conventional or proprietary process. Component region 18 can include materials typically found in semiconductor processing. The terminal 110 can act as a bonding pad for the component region 18. The terminal 110 can include a conductive material and be formed using a conventional or proprietary process. In a particular embodiment, the terminal 110 includes aluminum, copper, tungsten, or any combination thereof. A scribe line region 114, at which singulation of die locations can occur, lies between the die location 116 and an adjacent die location of the plurality of die locations of the workpiece 10. The scribe line 114 includes material that can be removed or cleaved through to form a die at die location 116. Thickness 112 can have a value in a range of approximately 100 to approximately 700 microns. In a particular embodiment, thickness 112 has a value in a range of approximately 200 to approximately 400 microns.

In one embodiment, the die location 116 of substrate 12 is determined to be a good die prior to singulating the die from substrate 12. At least some of the material from scribe line region 114 is removed during singulation, as illustrated in at location 1142 of scribe line region 114 of FIG. 1. Removing can include performing a conventional or proprietary a physical process (e.g. sawing, scribing, water jet), a chemical process (e.g., etching), an ablative process (e.g. laser or e-beam), or any combination thereof. In a particular embodiment, substrate 12 is mounted on another substrate (not illustrated) before singulating the die at the die location 116.

Figure 2:
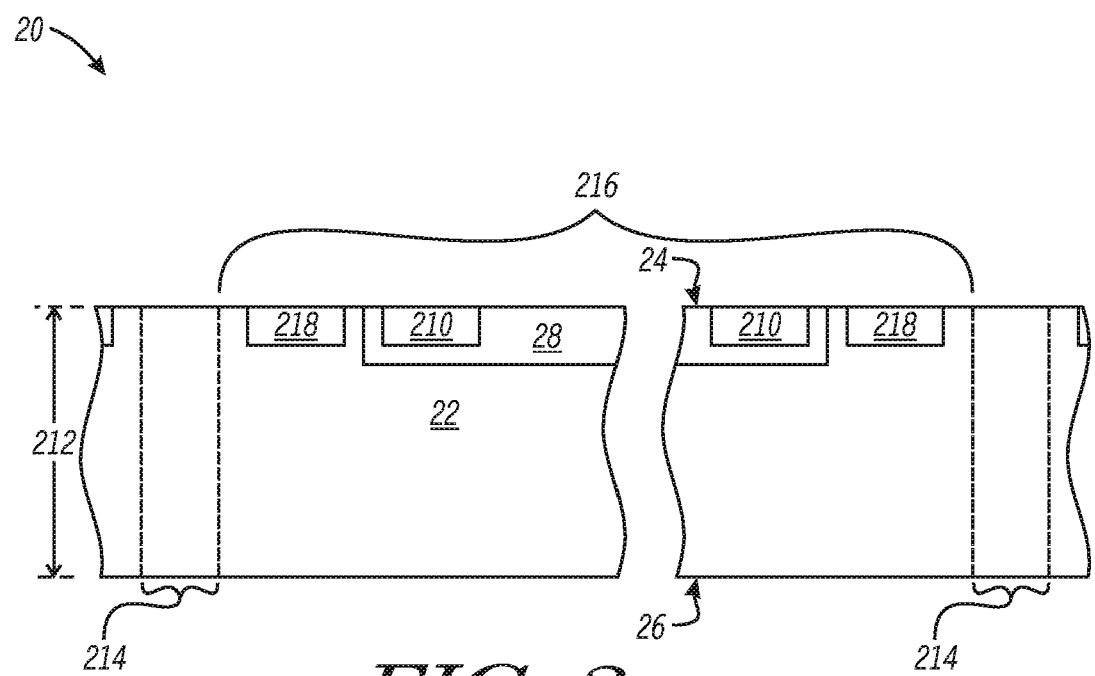
FIG. 2 includes an illustration of a cross-sectional view of a second workpiece including a second die of a second plurality of die on a second substrate.

FIG. 2 includes an illustration of a workpiece 20 including a substrate 22 having a front side surface 24 and a back side surface 26 and including a plurality of die locations, including a particular die location 216 where a die will be formed. In one embodiment, substrate 22 includes a material as previously describe with respect to substrate 12. Substrate 22 can include a same or different material than substrate 12. Front side surface 24 and back side surface 26 are spaced apart from each other by a thickness 212.

Die location 216 includes a component region 28 lying along front side surface 24. In one embodiment, component region 28 includes a circuit and a terminal 220. A transistor of component region 28 can serve as a portion of a same or different device type as described in an embodiment with respect to other component regions herein. Component region 28 can be formed using a same or different material typically used in semiconductor processing as component region 18.

Terminal 210 can act as an interconnect, such as a bonding pad for component region 28. In a particular embodiment, a terminal 218 lies along front side surface 24 of die location 216. Terminal 210, terminal 218, or any combination thereof can include a conductive material and be formed using a conventional or proprietary process as described in an embodiment with respect to other terminals described herein. In one embodiment, each terminal 110 along front side surface 14 of the die 116 of FIG. 1 has a corresponding terminal 218 along front side surface 24 of the die 216.

A scribe line region 214 lies between the die location 216 and adjacent die locations of the plurality of die locations of workpiece 20. Component region 28 can be formed using a same or different conventional or proprietary process as component region 18. Thickness 212 can have a value in a range of approximately 10 microns to approximately 700 microns. In a particular embodiment, thickness 212 lies in a range of approximately 100 to approximately 400 microns. Thickness 212 can have a same or different value than thickness 112. In one embodiment, die location 216 is determined to include a good die.

Figure 3:
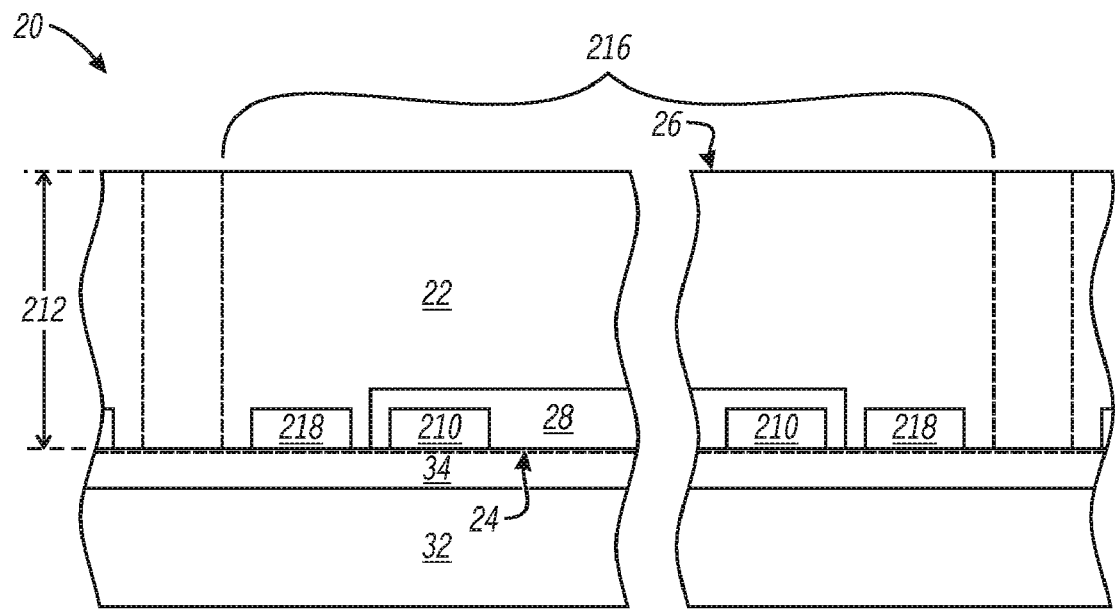
FIG. 3 includes an illustration of a cross-sectional view of the workpiece of FIG. 2 after attaching the second substrate to a handling substrate.

FIG. 3 includes an illustration of workpiece 20 of FIG. 2, after attaching front side surface 24 of substrate 22 to a handling substrate 32 using an adhesion layer 34. Substrate 22 is oriented such that front side surface 24 is adjacent to handling substrate 32 with adhesion layer 34 between substrate 22 and handling substrate 32. In one embodiment, handling substrate 32 is a rigid substrate, such that during processing, a side of handling substrate 32 can be used to hold a major surface of substrate 22 substantially in a plane. Handling substrate 32 supplies physical support to substrate 22 during processing. Handling substrate 32 has a thickness and is formed of a material compatible with subsequently preformed processing. In one embodiment, handling substrate 32 includes a semiconductor material and has a thickness of not less than 500 microns, such as in a range of 500 to 800 microns. In a particular embodiment, handling substrate 32 and adhesion layer 34 are transparent to a wavelength or spectrum of radiation, such that the location of features of front side surface 24, such as terminal 210 and terminal 218, can be determined during subsequent processing. In another embodiment, handling substrate 32 can have another thickness and be formed of another material.

Adhesion layer 34 serves to temporarily bond substrate 22 and handling substrate 32 to each other during subsequently performed processing. Adhesion layer 34 can include a material that can be selectively removed with respect to exposed material on front side surface 24 of substrate 22, handling substrate 32, or any combination thereof. In one embodiment, adhesion layer 34 includes an organic material. In another embodiment, the adhesion layer 34 includes a metal that is selectively removable with respect to terminal 218 and terminal 210. In a particular embodiment, adhesion layer 34 substantially comprises aluminum, when terminal 218 and terminal 210 substantially comprise copper. Adhesion layer 34 can be applied to substrate 22, handling substrate 32, or any combination thereof.

Figure 4:
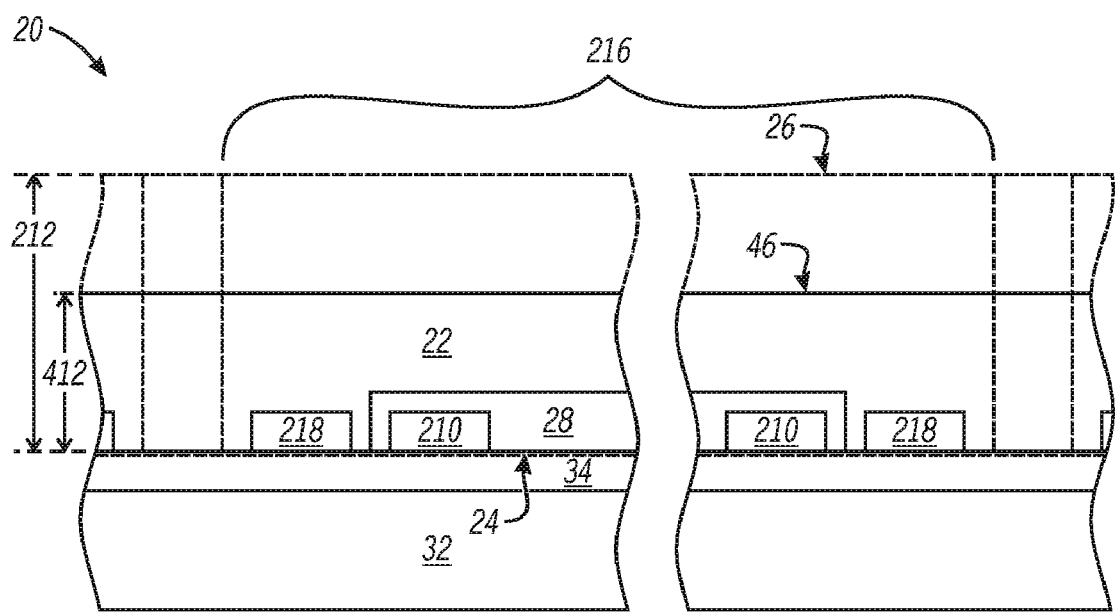
FIG. 4 includes an illustration of a cross-sectional view of the workpiece of FIG. 3 after removing a portion of the second substrate.

FIG. 4 includes an illustration of workpiece 20 after removing a backside portion of the substrate 22. In one embodiment, an exposed portion of substrate 22, i.e. starting at the back side surface 26, is removed by etching, lapping, grinding, ablating, polishing, or any combination thereof from workpiece 20. Such a process can reduce the difficulty of subsequently forming a through via within the die 216. Component region 28 can have a thickness substantially less than the total thickness of substrate 22 such that a portion of substrate 22 can be removed without compromising the functionality of component region 28. As illustrated, after removing a portion of substrate 22, a different back side surface 46 of substrate 22 is exposed and the substrate 22 has a thickness 412.

In one embodiment, the thickness 412 of the substrate 22 can be less than half of the thickness 112 of the substrate 12. In another embodiment, thickness 412 can be 90 microns or less.

Figure 5:
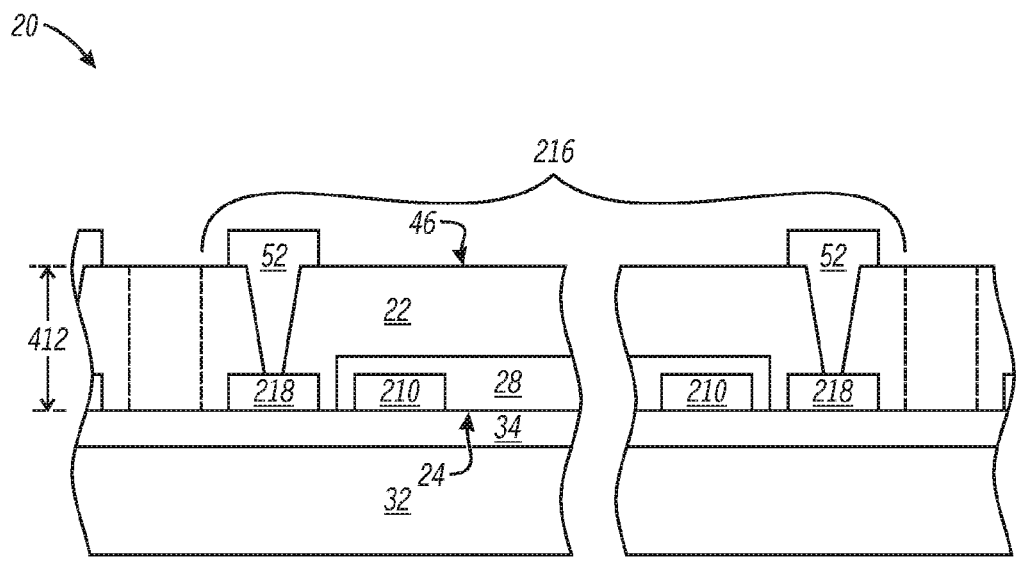
FIG. 5 includes an illustration of a cross-sectional view of the workpiece of FIG. 4 after forming a through via within the second die.

FIG. 5 includes an illustration of workpiece 20 after forming a through via 52 within a particular die location 216 of the substrate 22. Through via 52 is formed using a conventional or proprietary process. Through via 52 electrically connects terminal 218 at front side surface 24 to back side surface 46. For example, an opening is etched, ablated, or any combination thereof into substrate 22 to expose terminal 218. In one embodiment, the opening is formed beginning from the back side surface 46. In a particular embodiment, the diameter of the opening in the substrate 22 at the back side surface 46 can have a diameter approximately one tenth of the depth of the opening.

The opening can be substantially filled with a conductive material such that an electrical interconnect is formed within the opening between terminal 218 along front side surface 24 and back side surface 46 of the particular die location of substrate 22 that includes the die 216. Although not illustrated, in another embodiment, a redistribution layer can be formed. The redistribution layer can lie between the back side surface 46 and the front side surface of an adjacent die, such as front side surface 14. The redistribution layer can provide routing between each through via 52 and a terminal at a different location along the back side surface 46. The location of each terminal can be selected such that an electrical connection can be formed between each terminal along the back side surface 46 and a corresponding terminal of another die at a substantially same time. Thus, a terminal along the back side surface 46 of die 216 electrically connected to a terminal 218 on the front side of die 216 using through via 52 may or may not overlie each other.

In forming the through via 52, a blanket seed layer is deposited, followed by formation of a patterned insulating layer including an opening over the terminal 218 exposing the blanket seed layer (not illustrated). A conductive layer is plated through the opening in the patterned insulating layer, and the opening in the substrate 22 is filled using the plated conductive layer. In one embodiment, the plating process continues such that through via 52 extends outside of the opening in substrate 22 and beyond back side surface 46. In a particular embodiment, through via 52 includes a solder material. The patterned insulating layer can be removed, exposing the seed layer between the through vias 52. The seed layer can be blanket etched to substantially electrically isolate the through vias 52 from each other. In a particular embodiment, another patterned insulating layer (not illustrated) is formed and another conductive layer (not illustrated) is deposited prior to removing the seed layer.

Figure 6:
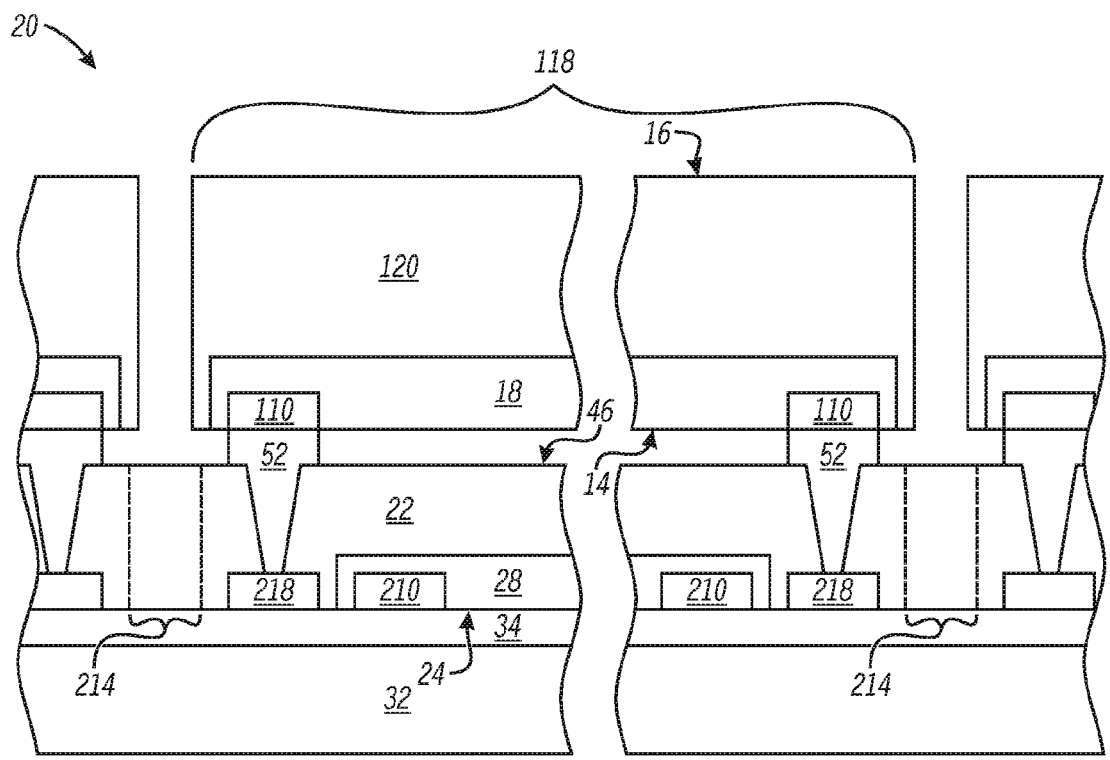
FIG. 6 includes an illustration of a cross-sectional view of the workpiece of FIG. 5 after attaching the first die to the second die.
Figure 7:
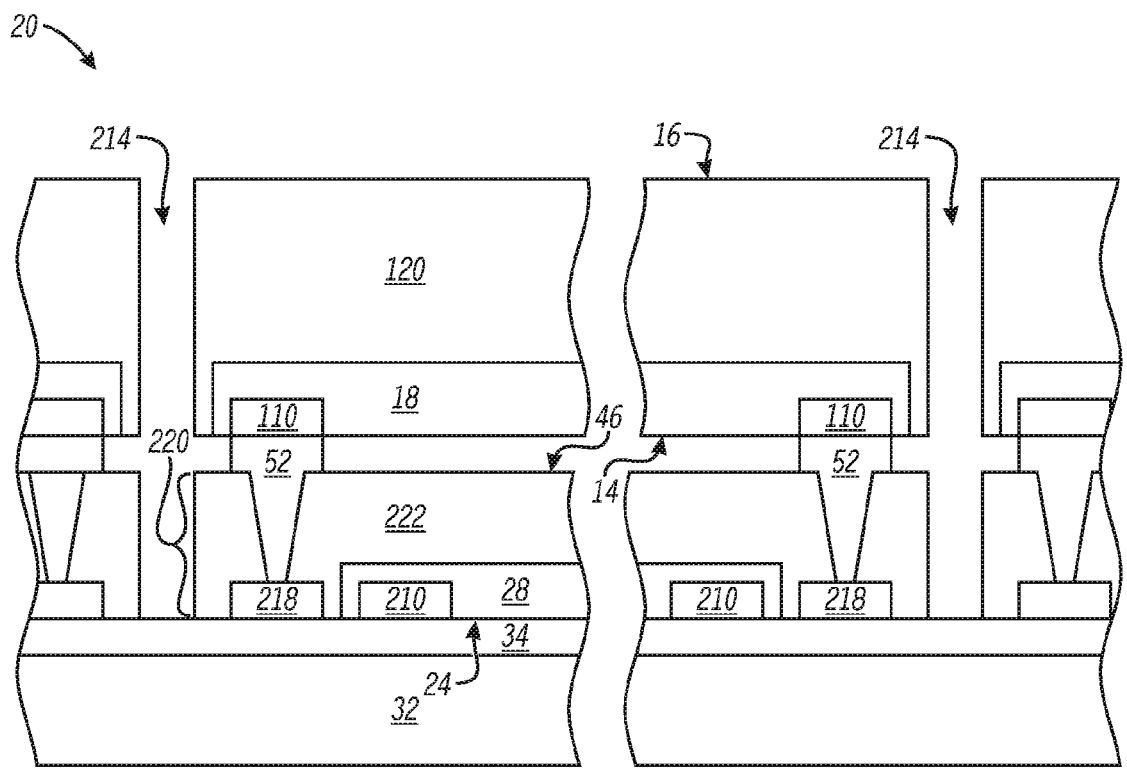
FIG. 7 includes an illustration of a cross-sectional view of the workpiece of FIG. 6 after singulating the second substrate.

FIG. 6 includes an illustration of workpiece 20 after forming an electrical connection between terminals 110 of a die 118, formed from die location 116 of FIG. 1, and terminals 218 of die location 216. After singulation of the substrate 12, the die location 116 becomes the die 118 having a die substrate 120. The die substrate 120 includes a portion of the substrate 12 that can be handled separately from the other die of the plurality of die of substrate 12.

The die 118 is oriented such that front side surface 14 of the die 118 and back side surface 46 of the die location 216 of the substrate 22 are front-to-back with respect to each other. Terminals 110 are electrically connected to through vias 52 such that terminals 110 are electrically connected to corresponding terminals 218. In one embodiment, workpiece 20 is annealed at a temperature sufficient to flow solder, thus electrically connecting terminal 110 and through via 32. In another embodiment, vibrational energy is applied to the workpiece 20 during electrically connecting terminal 110 and through via 32. An underfill layer may or may not be formed between die 118 and die location 216. In a particular embodiment, the workpiece 20 is tested and good die locations 216 are identified prior to attaching die 118 at die location 216. Thus, electrical connections are formed between each of a plurality of die 118 and an identified good die location 216 of the workpiece 20, and failed die locations of the workpiece 20 are left unpopulated. As will be illustrated in FIG. 6, FIG. 7 includes an illustration of workpiece 20 after singulating the particular die location 216 including the die 220 from substrate 22. At least some of the material is removed from scribe line region 214 by an embodiment previously described with respect to scribe line region 1142 of FIG. 1. The removal process can be a same or different process than was used for the scribe line region 1142. After singulation, die 220 includes a die substrate 222. The die substrate 222 includes a portion of the substrate 22 that can be handled separately from the balance of the plurality of die of the substrate 22. In one embodiment, the adhesion layer 34 lies exposed within scribe line region 214.

Figure 8:
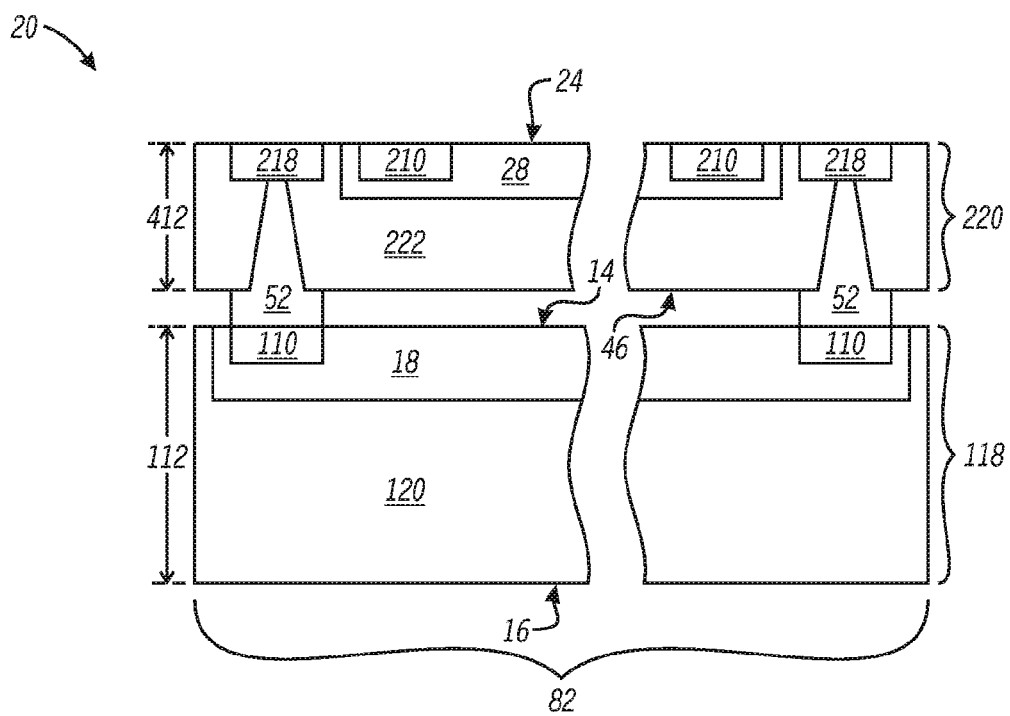
FIG. 8 includes an illustration of a cross-sectional view of a substantially complete electronic device.

FIG. 8 includes an illustration of a die stack 82, including die 118 and die 220. Wafer handling substrate 32 is removed from die stack 82 using a conventional or proprietary process. The adhesion layer 34 is removed from between die stack 82 and handling substrate 32. In another embodiment, a separation can be formed at the interface between adhesion layer 34 and front side surface 24 such that handling substrate 32 and adhesion layer 34 can be removed together from die stack 82.

In one embodiment, die stack 82 includes a substantially complete electronic device. Die stack 82 includes die 118 having front side surface 14 separated from back side surface 16 by thickness 112. Component region 18 lies along front side surface 14. Component region 18 can include a circuit and terminal 110. Die stack 82 also includes die 220 having front side surface 24 separated from back side surface 46 by thickness 412. In a particular embodiment, die 220 can have thickness 212. Component region 28 lies along front side surface 24. Component region 28 can include a same or different circuit as component region 18. Component region 28 of the die 220 also includes terminal 210. Die 220 also includes terminal 218.

An intrastack electrical connection of die stack 82 can include terminal 110 of die 118, through via 52, and terminal 218 of die 220. Although not illustrated, a conductive bump can be attached to terminal 218, terminal 210, or any combination thereof and serve as an extrastack electrical connection. Such a conductive bump can be formed on terminal 218, terminal 210, or any combination thereof using a conventional or proprietary process. The conductive bump can be formed separately from and later attached to terminal 218, terminal 210, or any combination thereof. In a particular embodiment, die stack 82 can be electrically tested to determine functionality of die stack 82 as a unit.

Figure 9:
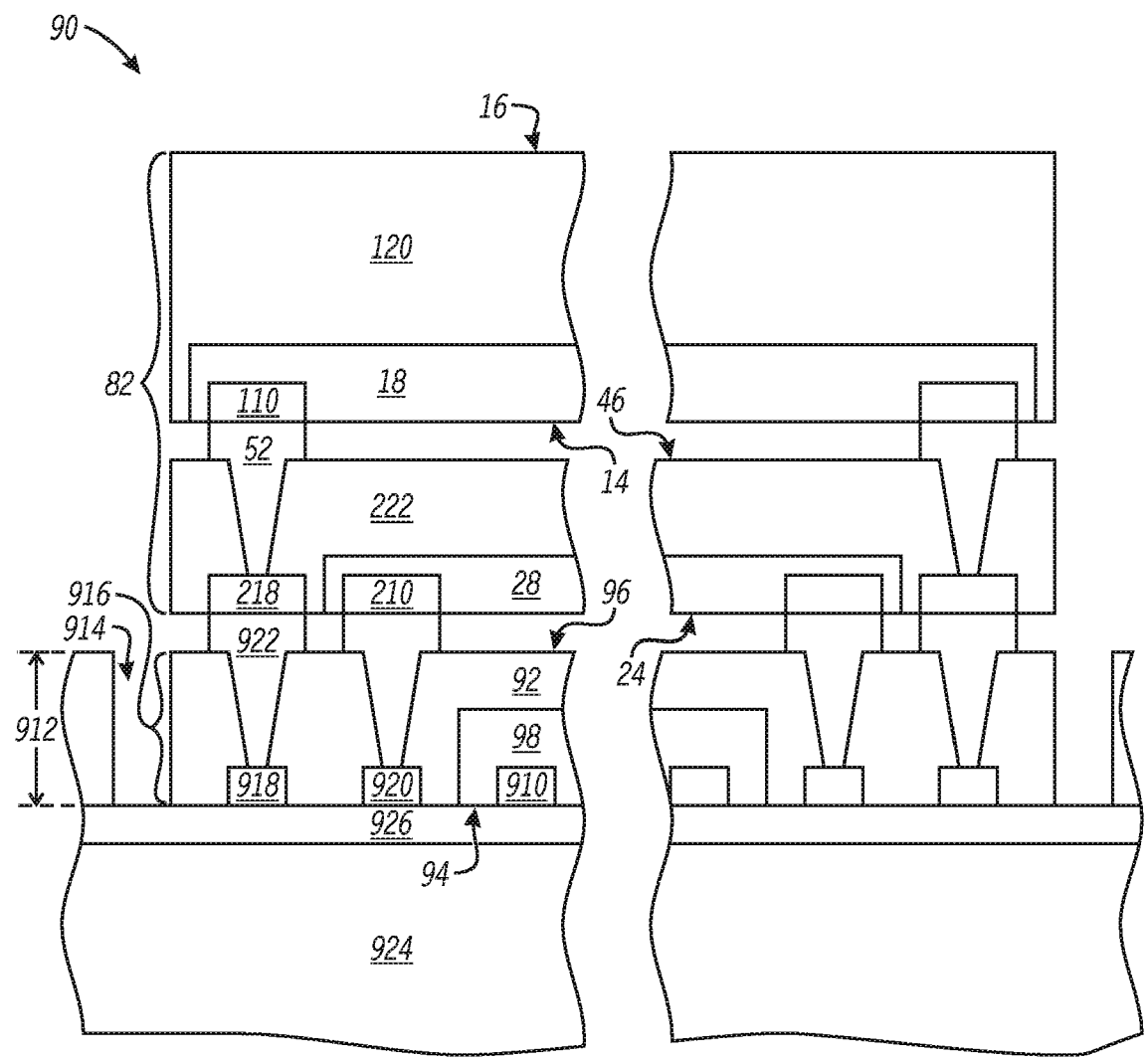
FIG. 9 includes an illustration of a cross-sectional view of a workpiece including the first, the second, and a third die, according to an alternative embodiment.

Alternatively, a more complex electronic device may be formed by including more than two die in the die stack. FIG. 9 includes an illustration of a workpiece 90, formed according to an alternative embodiment. As illustrated, a wafer substrate has a front side surface 94 and includes a plurality of die locations. A die 916 including a die substrate 92 has been singulated from the wafer substrate according to a previously describe embodiment. In one embodiment, wafer substrate from which the die 916 has been singulated includes a material as previously describe with respect to substrate 12. Die substrate 92 and other portions of the wafer substrate can include a same or different material than substrate 12 or the substrate 22.

Die 916 includes a component region 98 at front side 94. In one embodiment, component region 98 includes a transistor and a terminal 910. Component region 98 can include a same or different circuit as described with respect to component region 18, component region 28, or any combination thereof. Component region 98 can be formed using a same or different conventional or proprietary process as component region 18, component region 28 or any combination thereof. Component region 98 can be formed using a same or different material typically used in semiconductor processing, as compared to component region 18, component region 28, or any combination thereof.

In a particular embodiment, a terminal 918 and a terminal 920 lie along front side surface 94 at the die 916. In one embodiment, each terminal 918 and 920 along front side surface 94 has a corresponding terminal 218 or 210 along front side surface 24 of the die 216. A scribe line region 914 lies between die 916 and an adjacent die of the plurality of die of workpiece 90. In one embodiment, die 916 has been determined to be a good die.

Die substrate 92 is attached to a handling substrate 924 using an adhesion layer 926. In one embodiment, die substrate 92 is attached to handling substrate 924 using a same or different embodiment previously described for attaching the substrate 22 to handling substrate 32. Substrate 92, handling substrate 924, and adhesion layer 926 can include a same or different material and be formed by a same or different process as the substrate 22, handling substrate 32, and adhesion layer 34, respectively.

In one embodiment, a portion of substrate 92 is removed to form a back side 96 spaced apart from a front side 94 by a thickness 912. Thickness 912 can have a value in a range of previously described for thickness 412. Thickness 912 can have a same or different value than thickness 412. In a particular embodiment, thickness 912 is less than approximately half the thickness 112.

Through vias 922 are formed at the die 916 according to an embodiment previously described for forming through via 52 at the die location 216 of the substrate 22, except terminal 918 and terminal 920 are exposed within the openings. Through vias 922 can include a same or different material and be formed using a same or different embodiment as the through via 52.

The die 916 can be singulated from the substrate including the die substrate 92 after forming through vias 922 and before removal of the handling substrate 924. In one embodiment, the die 916 is singulated prior to forming an electrical connection to through vias 922. In another embodiment, die substrate 92 is singulated from the balance of the wafer substrate, after forming the electrical connection to the through via 922. As illustrated, at least some material is removed from scribe line region 914, such that the die 916 is spaced-apart from any die from adjacent die locations of the plurality of die locations formed on the substrate prior to singulating the die substrate 92 from the balance of the wafer substrate.

In one embodiment, die stack 82, including a plurality of die can be supplied. In a particular embodiment, die stack 82 can be formed as previously described with respect to FIGS. 1 though 8. Die stack 82 can be oriented such that front side surface 24 and back side surface 96 are front-to-back with respect to each other. Terminal 210 and terminal 218 are electrically connected to through vias 922 using an embodiment previously describe for terminal 110 and through via 52. Electrically connecting terminal 210 and terminal 218 to through vias 922 can be performed using a same or different process as electrically connecting the terminal 110 and through via 52.

Although not illustrated, processing can proceed as previously described with respect to workpiece 20 of FIG. 8. Handling substrate 924 is removed from a die stack including die 116, die 216, and die 916 by an embodiment previously described herein. As illustrated, terminal 110 of die 116 is electrically connected to through via 52 and terminal 218 of die 216. Terminal 210 and terminal 218 of die 216 are electrically connected to through vias 922 and terminal 918 and terminal 920 of the die 916, respectively. Thus, terminal 110 is electrically connected to though via 922 and terminal 918.

Thus an electronic device is formed including a die stack including a handling die that is relatively thicker than another die of the die stack that includes a through via. By stacking the handling die that is relatively thicker onto another die including a through via, a terminal along the front side of the handling die can be electrically connected at a terminal along the front side of the other die. The additional thickness of the handling die can add physical robustness to the structure and reduce the likelihood that the structure will be damaged during subsequent handling. Though vias are formed in relatively thinner die and thus require less etching and fill than would be required if the through vias were formed in a thicker die.

Also, by attaching a handling substrate to the front side of the other substrate during processing, a larger portion of the substrate can be removed without the risk of damaging the substrate during subsequent handling becoming unacceptably high. Thus the other die of the die stack can be thinner than if the handling substrate was not used during process. Additionally, by serially attaching and singulating at the addition of each die to the die stack rather than assembling all of the die into a die stack at one time, the intermediate die stack combination can be tested. By testing the intermediate die stack combination, stacking a poorly connected die stack onto good die or die location can be avoided. In an alternative embodiment, the process method is extended to include yet another die.

Many different aspects and embodiments are possible. Some of those aspects and embodiments are described below. After reading this specification, skilled artisans will appreciate that those aspects and embodiments are only illustrative and do not limit the scope of the present invention. For example, through vias may be partially formed and filled prior to performing the stacking process and subsequently exposed during the thinning of the substrate.

In a first aspect, a process of forming an electronic device can include attaching a first substrate to a handling substrate, wherein the first substrate includes a first plurality of die locations including a first die location including a first terminal at a first front side of the first die location, and, after attaching the first substrate, the first front side is adjacent to the handling substrate. The process can also include removing a portion of the first substrate after attaching the first substrate to expose a first back side surface, wherein the first back side surface is separated from a first front side surface by a first thickness. The process can further include forming a through via at the first die location, and forming an electrical connection between a second terminal at a second front side of a second die and the first terminal of the first die. Forming the electrical connection can include electrically connecting the second terminal and the through via to each other, and the second die can include a second back side surface spaced apart from a second front side surface by a second thickness. The first thickness can be less than half the second thickness. The process can still further include singulating the first die from the first substrate while the handling substrate is attached to the first substrate.

In one embodiment of the first aspect, forming an electrical connection between the first terminal and the second terminal further includes orienting the second die such that the second front side and the first back side are front-to-back with respect to each other. In another embodiment, attaching the first substrate to the handling substrate includes attaching the first substrate to the handling substrate wherein the handling substrate is a rigid substrate. In still another embodiment, after singulating the first die, the second die has the second thickness.

In another embodiment of the first aspect, prior to attaching the first substrate to the handling substrate, a first transistor lies at the first front side, and prior to forming the electrical connection between the second terminal at the second front side of the second die and the first terminal of the first die, a second transistor lies at the second front side. In still another embodiment, after removing the portion of the first substrate, the first thickness is less than approximately 90 microns.

In a particular embodiment of the first aspect, the process can further include removing a portion of a third substrate to expose a third back side surface. The third substrate can include a third plurality of die including a third die location, a third terminal can lie at a third front side of the third die location, and after removing the portion of the third substrate, the third back side surface can be separated from a third front side surface by a third thickness. The process can also include forming a through via at the third die location, and forming an electrical connection between the second terminal and the third terminal. Forming the electrical connection can include electrically connecting the second terminal and the through via at the third die location to each other, and the process can include singulating a third die from the third die location of the third substrate. In a more particular embodiment, the process can further include attaching the third substrate to a second handling substrate prior to removing a portion of the third substrate, wherein after attaching the third substrate, the third front side of the third substrate lies facing the second handling substrate. The process can also include removing the second handling substrate, after singulating the third die from the third substrate.

In a second aspect, a process of forming an electronic device can include attaching a first substrate to a handling substrate. The first substrate can include a first plurality of die locations including a first die location from which a first die can be subsequently singulated. The first die location can include a first front side and a first back side, and a first terminal can lie at the first front side. The handling substrate can be a rigid substrate. The process can also include forming a first through via at the first die location wherein the first through via is electrically connected to the first terminal. The process can further include forming an electrical connection between a second terminal at a second front side of a second die and the first terminal. Forming the electrical connection can include orienting the second die such that the second front side and the first back side are adjacent to each other.

In one embodiment of the second aspect, forming the electrical connection between the first terminal at the first front side and the second terminal at the second front side can include electrically connecting the first through via and the second terminal to each other. In a particular embodiment, the process can further include singulating the first die from the first substrate after forming the electrical connection between the first terminal and the second terminal, and removing the first die from the handling substrate. In a more particular embodiment, the process can further include orienting the first die such that the first front side and a third back side of a third die location of a third substrate are front-to-back with respect to each other. The process can also include electrically connecting the first terminal at the first front side and a third terminal at a third front side opposite the third back side of the third substrate after removing the handling substrate from the first die. Electrically connecting the first terminal can include electrically connecting a second through via in the third die and the first terminal at the first front side to each other.

In an even more particular embodiment of the second aspect, the process can further include electrically connecting the second terminal of the second die and the third terminal of the third die, wherein electrically connecting the second terminal includes electrically connecting the second through via and the second terminal to each other. In another even more particular embodiment, the process can further include removing a portion of the third substrate wherein after removing the portion of the third substrate, the third substrate has a third thickness. The process can also include singulating the third die from the third substrate after removing the portion of the third substrate. After singulating the third die, the second die can have a second thickness, and the third thickness less than half the second thickness. In a more particular embodiment, after singulating the third die, the second die is thicker than the first die or the third die.

In a third aspect, an electronic device can include a die stack including a first die and a second die. The first die can include a first substrate having a first front side surface and a first back side surface separated by a first thickness, and a first transistor lying at the first front side. The first transistor can include a first terminal lying at the first front side. The second die can include a second substrate having a second front side surface and a second back side surface separated by a second thickness. The second thickness can be less than approximately one half of the first thickness. The second thickness can be less than approximately 90 microns. The second die can also include a second transistor lying at the second front side, a first through via, and a second terminal lying at the second front side, and electrically connected to the first terminal, wherein the first terminal is electrically connected to the first through via.

In another embodiment of the third aspect, the second back side is closer to the first front side than the first back side. In a particular embodiment, the electronic device can further include a third die. The third die can include a third substrate having a third thickness less than approximately one half of the first thickness, and a third transistor lying at a third front side. In a more particular embodiment, the second thickness is different from the third thickness. In another more particular embodiment, the third die an further include a second through via, and a third terminal lying at the third front side. The third terminal can be electrically connected to the first terminal, wherein the first terminal is electrically connected to the second through via.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
    attaching a first substrate to a first handling substrate, wherein the first substrate includes a bulk semiconductor material, a first plurality of die locations including a first die location including a first terminal at a first front side surface of the first die location, and, after attaching the first substrate, the first front side surface is adjacent to the first handling substrate;
    removing a portion of the first substrate after attaching the first substrate to expose a first back side surface, wherein the first back side surface is separated from a first front side surface by a first thickness;
    forming a first through via at the first die location;

forming a first electrical connection between a second terminal at a second front side surface of a second die and the first terminal of the first die, wherein:
  forming the first electrical connection includes electrically connecting the second terminal and the first through via to each other;
  the second die is a singulated die during formation of the first electrical connection;
  the second die includes a second back side surface spaced apart from a second front side surface by a second thickness; and
  the first thickness is less than half the second thickness;
singulating the first die from the first substrate while the first handling substrate is attached to the first substrate; and
removing the first handling substrate after singulating the first die from the first substrate.

2. The process of claim 1, wherein forming the first electrical connection between the first terminal and the second terminal further includes orienting the second die such that the second front side surface and the first back side surface are front-to-back with respect to each other.

3. The process of claim 1, wherein:
forming the first electrical connection further comprises forming a second electrical connection between another second terminal at the second front side surface of the second die and another first terminal at the first back side surface of the first die, wherein the first and second electrical connections are spaced apart from side edges of the first and second die; and
after singulating the first die, a void is disposed between and immediately adjacent to the first and second electrical connections along the first front side surface of the first substrate and the second back side surface of the second substrate.

4. The process of claim 1, wherein after singulating the first die, the second die has the second thickness.

5. The process of claim 1, wherein:
prior to attaching the first substrate to the first handling substrate, a first transistor lies at the first front side surface; and
prior to forming the first electrical connection between the second terminal at the second front side surface of the second die and the first terminal of the first die, a second transistor lies at the second front side surface.

6. The process of claim 1, wherein:
removing a portion of the first substrate comprises removing only a portion of a bulk semiconductor material of the first substrate to leave a remaining portion of the bulk semiconductor material, and after removing the portion of the first substrate, the first thickness is less than approximately 90 microns; and
forming an opening through only a portion of the first thickness of the first substrate, wherein the opening extends through the remaining portion of the bulk semiconductor material.

7. The process of claim 1, further including:
after removing the first handling substrate, attaching a third substrate to a second handling substrate, wherein the third substrate includes a third plurality of die including a third die location, a third terminal lies at a third front side surface of the third die location;
removing a portion of a third substrate to expose a third back side surface, wherein after removing the portion of the third substrate, the third back side surface is separated from a third front side surface by a third thickness;
forming a second through via at the third die location;

forming a second electrical connection between the second terminal and the third terminal wherein forming the second electrical connection includes electrically connecting the second terminal and the second through via at the third die location to each other; and
removing the second handling substrate, after forming the second electrical connection between the second and third terminals.

8. The process of claim 7, wherein the second thickness and the third thickness have substantially a same value.

9. A process of forming an electronic device comprising:
attaching a first substrate to a handling substrate wherein the first substrate includes a first plurality of die locations including a first die location from which a first die can be subsequently singulated, wherein:
  the first die includes a first front side surface and a first back side surface;
  a first terminal and a transistor component region of the first die lie at the first front side surface; and
  the handling substrate is a rigid substrate;
forming a first through via that extends from the first terminal towards the first back surface and through a remaining thickness of the first die wherein the first through via is electrically connected to the first terminal; and
flowing solder to form a first electrical connection between a second terminal at a second front side surface of a second die and the first terminal, and a second electrical connection between another second terminal at the second front side surface of the second die and another first terminal at the front side of the first die, wherein forming the electrical connection includes orienting the second die such that the second front side surface and the first back side surface are adjacent to each other,
wherein after flowing the solder, a void is disposed between the first and second electrical connections along the first front side surface of the first substrate and the second back side surface of the second substrate.

10. The process of claim 9, wherein flowing the solder includes electrically connecting the first through via and the second terminal to each other.

11. The process of claim 9, further including:
singulating the first die from the first substrate after flowing the solder; and
removing the first die from the handling substrate.

12. The process of claim 11, further including:
orienting the first die such that the first front side surface and a third back side surface of a third die location of a third substrate are front-to-back with respect to each other; and
electrically connecting the first terminal at the first front side surface and a third terminal at a third front side surface opposite the third back side surface of the third substrate after removing the handling substrate from the first die, wherein electrically connecting the first terminal includes electrically connecting a second through via in the third die and the first terminal at the first front side surface to each other.

13. The process of claim 12, further including electrically connecting the second terminal of the second die and the third terminal of the third die, wherein electrically connecting the second terminal includes electrically connecting the second through via and the second terminal to each other.

14. The process of claim 12, further including:
removing a portion of the third substrate wherein after removing the portion of the third substrate, the third substrate has a third thickness; and singulating the third die from the third substrate after removing the portion of the third substrate, wherein after singulating the third die:

the second die has a second thickness; and the third thickness less than half the second thickness.

15. The process of claim 14, wherein after singulating the third die, the second die is thicker than the first die and the third die.

16. The process of claim 9, further comprising removing a portion of the first substrate after attaching the first substrate to the handling substrate and before forming the first through via, wherein after removing the portion of the first substrate, a remaining portion of the first substrate has a thickness is less than approximately 90 microns.

17. The process of claim 9, wherein flowing the solder is performed after forming the first through via.

18. The process of claim 9, further comprising plating a conductive layer within first through via before flowing the solder.

19. The process of claim 1, wherein the second thickness is in a range of approximately 200 microns to approximately 400 microns 20. The process of claim 1, wherein forming the first electrical connection comprises plating a conductive layer.

* * * * *